(12) United States Patent
Na et al.

(10) Patent No.: US 10,715,100 B2
(45) Date of Patent: Jul. 14, 2020

(54) ACOUSTIC WAVE FILTER DEVICE AND METHOD OF MANUFACTURING THE SAME

(71) Applicant: SAMSUNG ELECTRO-MECHANICS CO., LTD., Suwon-si (KR)

(72) Inventors: Seong Hun Na, Suwon-si (KR); Jae Hyun Jung, Suwon-si (KR); Seung Wook Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 533 days.

(21) Appl. No.: 15/674,833

(22) Filed: Aug. 11, 2017

(65) Prior Publication Data

US 2018/0159496 A1    Jun. 7, 2018

(51) Int. Cl.
| | |
|---|---|
| H01L 41/053 | (2006.01) |
| H01L 41/22 | (2013.01) |
| H03H 9/25 | (2006.01) |
| H03H 9/02 | (2006.01) |
| H03H 3/08 | (2006.01) |
| H01L 41/09 | (2006.01) |
| H01L 41/18 | (2006.01) |
| H03H 9/145 | (2006.01) |
| H01L 41/332 | (2013.01) |

(52) U.S. Cl.
CPC ......... *H03H 9/02574* (2013.01); *H01L 41/09* (2013.01); *H01L 41/18* (2013.01); *H01L 41/332* (2013.01); *H03H 3/08* (2013.01); *H03H 9/02614* (2013.01); *H03H 9/145* (2013.01)

(58) Field of Classification Search
CPC .. H03H 9/02574; H03H 3/08; H03H 9/02614; H03H 9/145; H01L 41/09; H01L 41/18; H01L 41/332
USPC ......................................... 310/311–371, 800
See application file for complete search history.

(56) References Cited

U.S. PATENT DOCUMENTS

| | | | |
|---|---|---|---|
| 2002/0047501 A1 | 4/2002 | Tsuda et al. | |
| 2015/0194948 A1 | 7/2015 | Inate | |
| 2017/0271222 A1* | 9/2017 | Kang | H01L 23/055 |
| 2017/0288123 A1* | 10/2017 | Hatano | H03H 3/08 |

FOREIGN PATENT DOCUMENTS

| | | |
|---|---|---|
| JP | 11-239038 A | 8/1999 |
| JP | 2011-23929 A | 2/2011 |
| KR | 10-2002-0032351 A | 5/2002 |
| KR | 10-0878933 B1 | 1/2009 |
| KR | 10-1645172 B1 | 8/2016 |

\* cited by examiner

*Primary Examiner* — Thomas M Dougherty
(74) *Attorney, Agent, or Firm* — NSIP Law

(57) ABSTRACT

An acoustic wave filter device includes a substrate, a filter disposed on the substrate, a wall member disposed on the substrate and surrounding the filter, and a cap member disposed above the wall member and, with the wall member, forming an internal space. The cap member has a curved shape and comprises a first cap member comprising a first material and a second cap member comprising a second material.

19 Claims, 5 Drawing Sheets

ACOUSTIC WAVE FILTER DEVICE AND METHOD OF MANUFACTURING THE SAME

CROSS-REFERENCE TO RELATED APPLICATION(S)

This application claims the benefit under 35 USC 119(a) of Korean Patent Application No. 10-2016-0164468 filed on Dec. 5, 2016 in the Korean Intellectual Property Office, the entire disclosure of which is incorporated herein by reference for all purposes.

BACKGROUND

1. Field

The following description relates to an acoustic wave filter device and a method of manufacturing the same.

2. Description of Related Art

Currently, most wafer-level packages (WLP) having a cavity include a micro-electro-mechanical-system (MEMS) and a filter package.

As filter packages included in wafer-level packages have become smaller and thinner, manufacturing techniques such as chip-scale packaging (CSP), wafer-to-wafer level packaging, and film packaging, among others, have been developed. Acoustic wave filter devices have been manufactured using these manufacturing techniques.

During a manufacturing process of an acoustic wave filter device, and specifically during the molding process, when internal pressure increases in order to realize a proper internal pressure for molding, and/or when a polymer having a low strain rate is used as a cap member, it is necessary to have a thicker cap member to avoid deformation or other problems. Inclusion of a thicker cap member is problematic in the production of thin acoustic wave filter packages as it increases thickness of the overall package.

Thus, it is necessary to develop a structure capable of reducing a thickness of a cap member while ensuring proper internal pressure. In other words, it is necessary to develop a structure capable of suppressing deformation of a cap member during a molding process.

SUMMARY

This Summary is provided to introduce a selection of concepts that are further described below in the Detailed Description in simplified form. This Summary is not intended to identify key features or essential features of the claimed subject matter, nor is it intended to be used as an aid in determining the scope of the claimed subject matter.

According to an exemplary embodiment, an acoustic wave filter device includes a substrate, a filter disposed on the substrate, a wall member disposed on the substrate and surrounding the filter, and a cap member disposed above the wall member and, with the wall member, forming an internal space. The cap member has a curved shape and comprises a first cap member comprising a first material and a second cap member comprising a second material.

The first cap member may be disposed on the wall member, the second cap member may be disposed on the first cap member, and at least one of the first cap member and the second cap member may have a residual stress curvature.

The cap member may include an upwardly convex central portion.

The first cap member may have a same thickness as or thinner thickness than a thickness of the second cap member.

The acoustic wave filter may also include a metal layer disposed on the substrate outside of the wall member in a top-down view.

The acoustic wave filter device may also include an under-bump metal member disposed on the metal layer.

The acoustic wave filter device may also include a bump disposed on the under-bump metal member and a molding layer disposed such that the under-bump metal member, the wall member, and the cap member are embedded, and such that the bump is partially externally exposed.

A metal film may be disposed under the bump and on the under-bump metal member.

The molding layer may be disposed on the cap member.

The second material comprising the second cap member may have a greater elastic modulus than an elastic modulus of the first material comprising the first cap member.

The first material comprising the first cap member and the second material comprising the second cap member may be different metals.

According to an exemplary embodiment, a method of manufacturing an acoustic wave filter device includes forming a filter on a substrate, forming a wall member to surround the filter, forming a cap member having an upwardly convex central portion. The cap member includes a first cap member formed on the wall member and a second cap member formed on the first cap member.

The first cap member may have a same thickness as or thinner thickness than a thickness of the second cap member.

The material comprising the first cap member and the material forming the second cap member may be different metals.

The second material forming the second cap member may have a greater elastic modulus than an elastic modulus of the first material forming the first cap member.

The second cap member may be formed by an electroless or electrolytic plating process.

Forming the second cap member may include applying tensile stress to the second cap member when the second cap member is formed such that residual stress remains in the second cap member after the second cap member is formed.

Forming the first cap member may include bonding a metal sheet to the wall member and removing an edge of the metal sheet.

Manufacturing an acoustic wave filter device may further include forming a metal layer on the substrate during the same process as forming the filter on the substrate.

Examples provide an acoustic wave filter device capable of reducing narrowing of an internal space in which a filter is disposed when a molding layer is formed, and a method of manufacturing the same.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
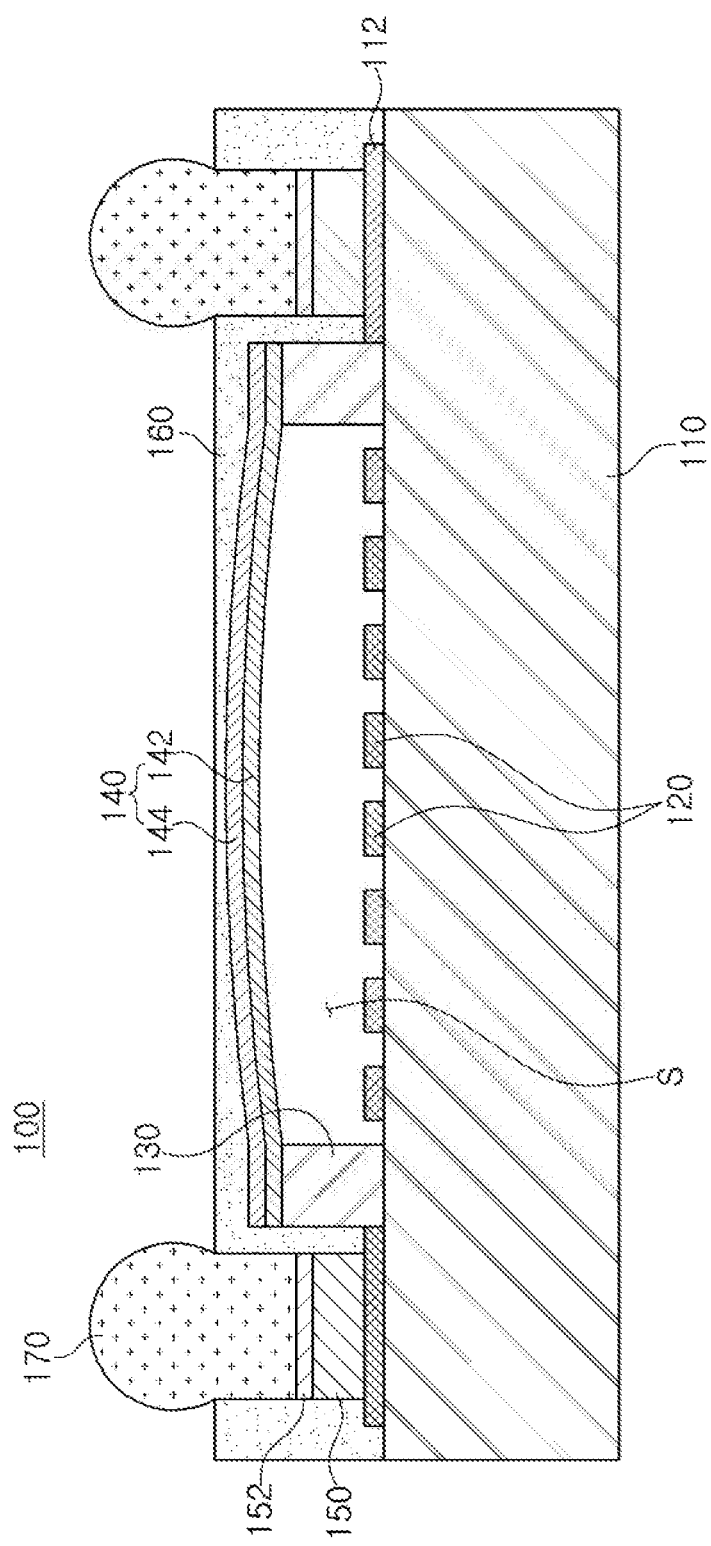
FIG. 1 is a schematic cross-sectional view illustrating an acoustic wave filter device according to an exemplary embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Subsequently, examples are described in further detail with reference to the accompanying drawings.

Unless indicated otherwise, a statement that a first layer is "on" or "connected to" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation.

FIG. 1 is a schematic cross-sectional view illustrating an acoustic wave filter device according to an exemplary embodiment.

Referring to FIG. 1, an acoustic wave filter device 100 according to an exemplary embodiment includes a substrate 110, a filter unit 120, a wall member 130, a cap member 140, an under-bump metal member 150, a molding layer 160, and a bump 170.

The substrate 110 may be a piezoelectric substrate. For example, the substrate 110 may be a substrate in which a piezoelectric single crystal, such as $LiTaO_3$, $LiNbO_3$, etc., a piezoelectric ceramic, and/or a piezoelectric thin film, is formed on a main surface. However, these are merely exemplary, and piezoelectric single crystals may be formed of other materials or combinations of materials.

A metal layer 112 formed to surround the filter unit 120 in a top-down view may be formed on the substrate 110. The metal layer 112 may be formed of the same material as the filter unit 120. For example, the metal layer 112 may be formed to contain one or more of titanium (Ti), nickel (Ni), aluminum (Al), copper (Cu), or AlCu.

As described above, the metal layer 112 and the filter unit 120 may be formed of the same material, so formation of the metal layer 112 may be more easily performed. Thus, the process of forming the metal layer 112 and the filter layer 120 may have increased efficiency.

The metal layer 112 and the filter unit 120 may be formed by a chemical vapor deposition (CVD) or a physical vapor deposition (PVD) process, but the formation process is not limited thereto. For example, the metal layer 112 and the filter unit 120 may be formed by a plating method, a metalorganic chemical vapor deposition (MOCVD), or the like.

As shown in FIG. 1, The filter unit 120 may be formed in a central portion of the substrate 110. For example, the filter unit 120 may be formed in a single interdigital (IDT) pattern, however, embodiments are not limited thereto. For example, various IDT patterns may be formed together on the portion of the substrate 110 to form the filter unit 120. The metal layer 112 and the wall member 130 may be formed to surround the filter unit 120 in a top-down view.

The filter unit 120 may be formed of the same material as the metal layer 112, as described above.

The wall member 130 may be formed to surround the filter unit 120 in a top-down view, and may form an internal space S bounded by the cap member 140. The wall member 130 may be formed of, for example, a photoimageable film, but is not limited thereto. As only an example, the wall member 130 may be formed of one of a liquid resin or a film resin.

The cap member 140 may be formed above the wall member 130 and may form the internal space S with the wall member 130. The cap member 140 may be formed of at least two materials having different physical characteristics, and may have a shape having a curvature, as shown in FIG. 1.

For example, the cap member 140 may include a first cap member 142 formed at least partially on the wall member 130, and a second cap member 144 formed on the first cap member 142. When at least one of the first cap member 142 and the second cap member 144 is manufactured, tensile stress is applied, so the cap member 140 may have a curvature due to residual stress.

As an example, the cap member 140 may have a dome shape whose central portion is upwardly convex, as shown in FIG. 1.

The first cap member 142 and the second cap member 144 may be formed of different materials, for example, different metal materials. However, this is merely an example, as the cap members may be formed of different materials that may include or may not include metal elements. The first cap member 142 and the second cap member 144 may be formed of materials at different strain rates.

The first cap member 142 may have a thickness the same as or thinner than a thickness of the second cap member 144. Thus, the cap member 140 may have a central portion that is upwardly convex, rather than a shape of a central portion which is downwardly concave.

The second cap member 144 may be formed of a material having a higher elastic modulus than that of the first cap member 142.

The first cap member 142 is formed to be at least partially supported by an upper surface of the wall member 130. For example, a metal sheet may be bonded to the wall member 130 using a hot press forming apparatus, a wafer bonder, a vacuum laminator, etc. The first cap member 142 may be formed using a photolithography process and a wet etching process thereafter.

Thereafter, the second cap member 144 may be formed using electroless or electrolytic plating.

However, an example is not limited thereto, and a metal sheet may be bonded to the wall member 130 using a hot press forming apparatus, a wafer bonder, or a vacuum laminator, and the second cap member 144 is formed on a metal sheet using electroless plating or electrolytic plating. Thereafter, the first cap member 142 may be formed using a photolithography process and a wet etching process.

As described above, the second cap member 144 may be formed of a material having a higher elastic modulus than the first cap member 142. The second cap member 144 may be formed using electroless or electrolytic plating. Thus, as residual stress remains in the second cap member 144, a central portion of the cap member 140 may have a shape which is upwardly convex, as shown in FIG. 1.

The under-bump metal member 150 is formed on the metal layer 112 of the substrate 110. Further, a metal film 152 may be formed to allow the bump 170 to be bonded to the under-bump metal member 150. The metal film 152 may include a suitable metal depending on a metal forming the under-bump metal member 150. However, the metal film 152 is not necessarily required.

The under-bump metal member 150 may be exposed externally through an opening 162 (see FIG. 8) of the molding layer 160, during manufacturing, which will be described later.

The molding layer 160 may be formed to expose the bump 170 externally, and may be formed to embed the under-bump metal member 150, the wall member 130, and the cap member 140 therein. In other words, the bump 170 may be inserted into and disposed in an opening 162 (see FIG. 8) of the molding layer 160, such that remaining elements, such as the under-bump metal member 150, the wall member 130, and the cap member 140 disposed in the molding layer 160 are isolated from the outside.

The molding layer 160 may be formed of a polymer material, such as a synthetic resin material, but is not limited thereto.

As described above, the molding layer 160 may be formed to cover the internal space S formed by the wall member 130 and the cap member 140. When the molding layer 160 is formed, uniform pressure is applied to the cap member 140.

In accordance with the above, the cap member 140 may have a shape having an upwardly convex curvature. That is, due to pressure applied when the molding layer 160 is formed, a central portion of the cap member 140 may be prevented from being deformed to be downwardly concave.

The bump 170 is formed on the under-bump metal member 150, and may be formed to pass through an opening 162 (see FIG. 8) of the molding layer 160 to be externally exposed, as shown in FIG. 1.

As described above, a central portion of the cap member 140 may have a dome shape, which is upwardly convex. Thus, due to pressure applied when the molding layer 160 is formed, a central portion of the cap member 140 may be prevented from being deformed to be downwardly concave.

Further, due to the first cap member 142 and the second cap member 144 being formed of metal materials, an increase in a thickness, caused by the cap member 140, may be prevented.

Since the cap member 140 is formed in a simple process, the cap member 140 may be prevented from being deformed during the manufacturing process, and the manufacturing process may be less complicated.

Hereinafter, a method of manufacturing an acoustic wave filter device according to an exemplary embodiment will be described with reference to the accompanying drawings.

FIGS. 2, 3, 4, 5, 6, 7, 8, and 9 are process diagrams illustrating a method of manufacturing an acoustic wave filter device according to an exemplary embodiment.

Figure 2:
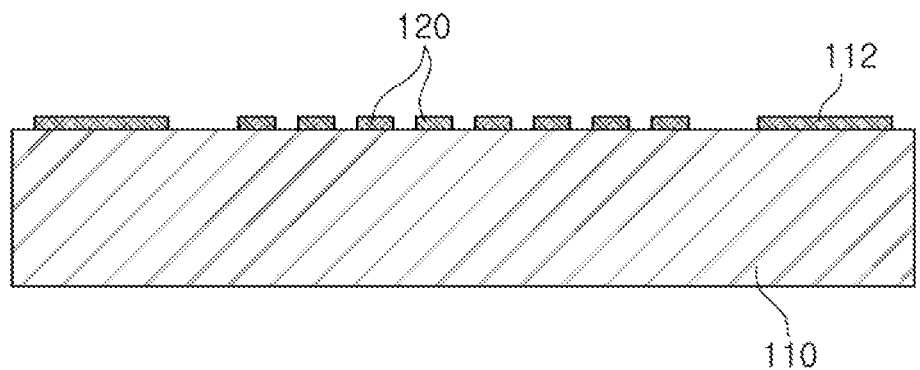
FIGS. 2, 3, 4, 5, 6, 7, 8, and 9 are diagrams illustrating a method of manufacturing an acoustic wave filter device according to an exemplary embodiment.

As shown in FIG. 2, the filter unit 120 may be formed on an upper surface of a central portion of the substrate 110. For example, the filter unit 120 may be formed of an IDT pattern. The filter unit 120 may be formed to be disposed inside of the metal layer 112 formed on the substrate 110.

Figure 3:
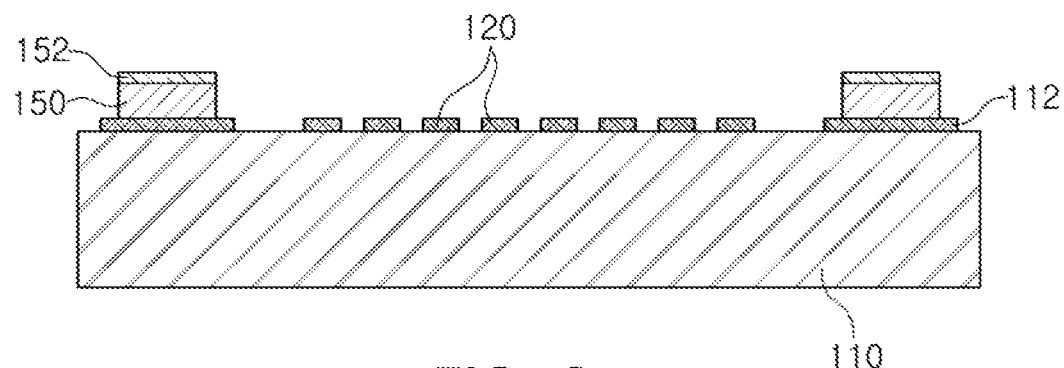

As illustrated in FIG. 3, the under-bump metal member 150 may be formed on an upper surface of the metal layer 112 disposed on the substrate 110. The metal film 152 may be formed on an upper surface of the under-bump metal member 150 to allow the under-bump metal member 150 to be easily connected to the bump 170, which will be described later. A configuration in which the metal film 152 is formed on an upper surface of the under-bump metal member 150 is illustrated by way of example, but is not limited thereto. That is, the metal film 152 may be omitted and bump 170 may be disposed directly on under-bump metal member 150.

The under-bump metal member 150 may be formed, for example, by an electrolytic plating method, but other methods may be used.

Figure 4:
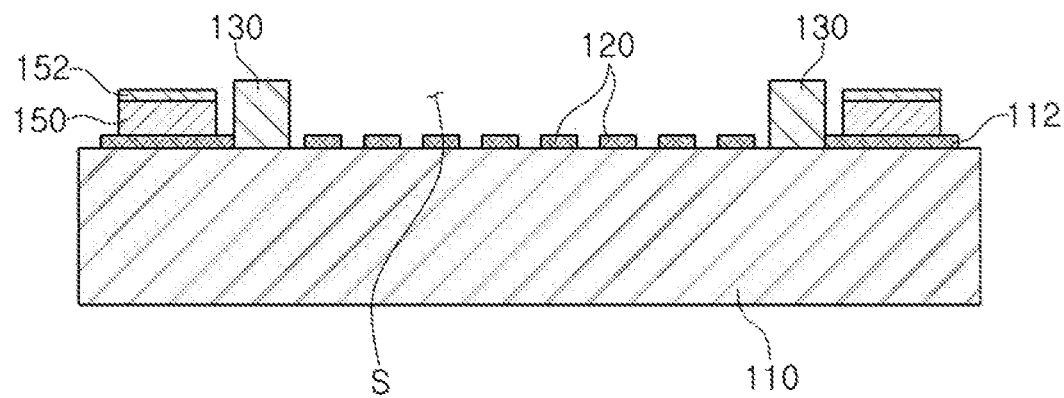

As illustrated in FIG. 4, the wall member 130 may be disposed on the substrate 110 between the metal layer 112 and the filter unit 120, and may be formed to surround the filter unit 120 in a top-down view. The wall member 130 may be formed of a photoimageable film, but is not limited thereto. For example, the wall member 130 may be formed of a liquid resin or a film resin.

The wall member 130 may have a shape having the internal space S and may have a strip-like shape having an open upper portion in a top-down view.

Figure 5:
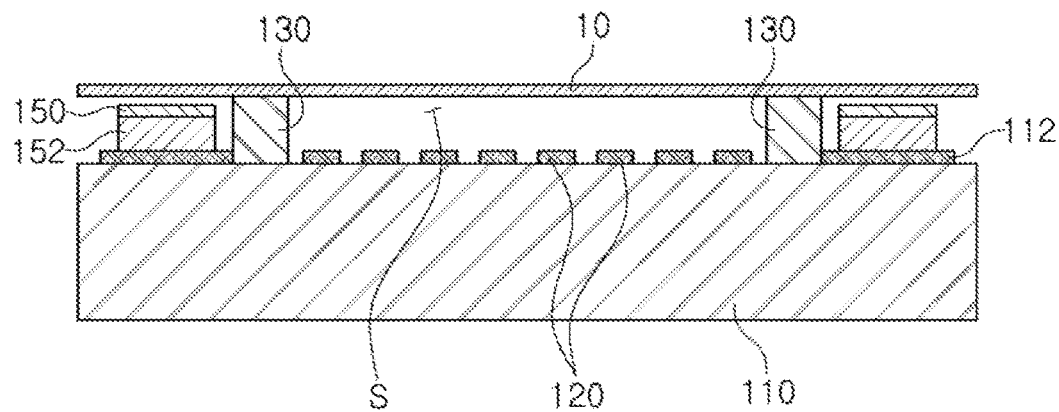

As illustrated in FIG. 5, a metal sheet 10 may be bonded to the wall member 130 using a hot press forming apparatus, a wafer bonder, a vacuum laminator, or another appropriate method.

Figure 6:
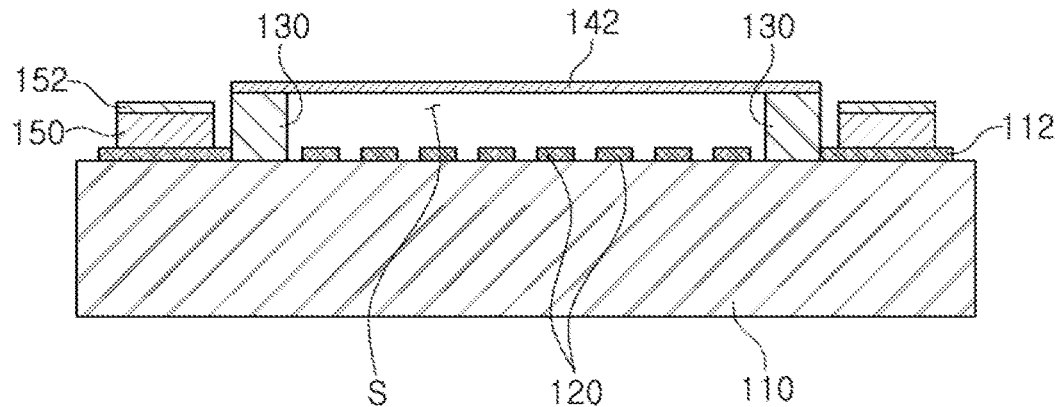

As illustrated in FIG. 6, the metal sheet 10, bonded to the wall member 130, is forms the first cap member 142 via a photolithography process and a wet etching process.

Figure 7:
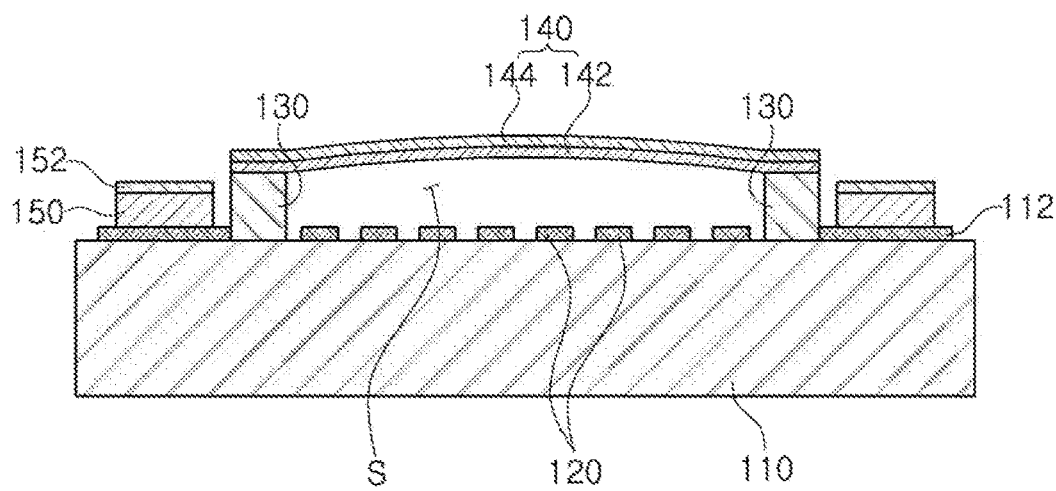

As illustrated in FIG. 7, the second cap member 144 is formed on the first cap member 142. In this case, the second cap member 144 may be formed using, for example, electroless or electrolytic plating. The second cap member 144 may have a thickness the same as or thicker than that of the first cap member 142. The second cap member 144 may be formed of the same metal material as the first cap member 142 but is not limited thereto. For example, the second cap member 144 may be formed of a material having a higher elastic modulus than that of the first cap member 142.

Thus, as illustrated in FIG. 7, the cap member 140 may have a dome shape having an upwardly convex central portion.

A case in which the second cap member 144 is sequentially formed after the first cap member 142 is illustrated by way of example, but is not limited thereto. For example, the metal sheet 10 may be bonded to the wall member 130 using a hot press forming apparatus, a wafer bonder, a vacuum laminator, or other appropriate device, and the second cap member 144 may be formed on the metal sheet 10 using electroless plating or electrolytic plating. Thereafter, using, for example a photolithography process and a wet etching process, the metal sheet 10 may form the first cap member 142.

Figure 8:
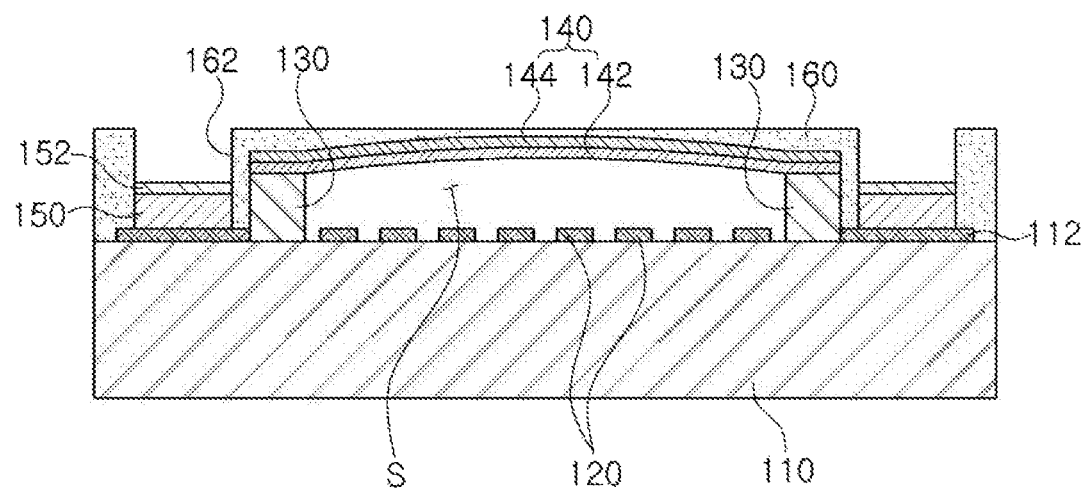

As illustrated in FIG. 8, opening 162 is formed and the molding layer 160 is formed to embed the under-bump metal member 150, the wall member 130, and the cap member 140 therein. In this case, the under-bump metal member 150 is exposed externally through the opening 162.

The molding layer 160 is formed to cover the internal space S formed by the wall member 130 and the cap member 140. When the molding layer 160 is formed, uniform pressure is applied to the cap member 140.

As described above, the cap member 140 may have an upwardly convex curvature shape. That is, due to pressure applied when the molding layer 160 is formed, a central portion of the cap member 140 is prevented from being deformed to be downwardly concave.

Figure 9:
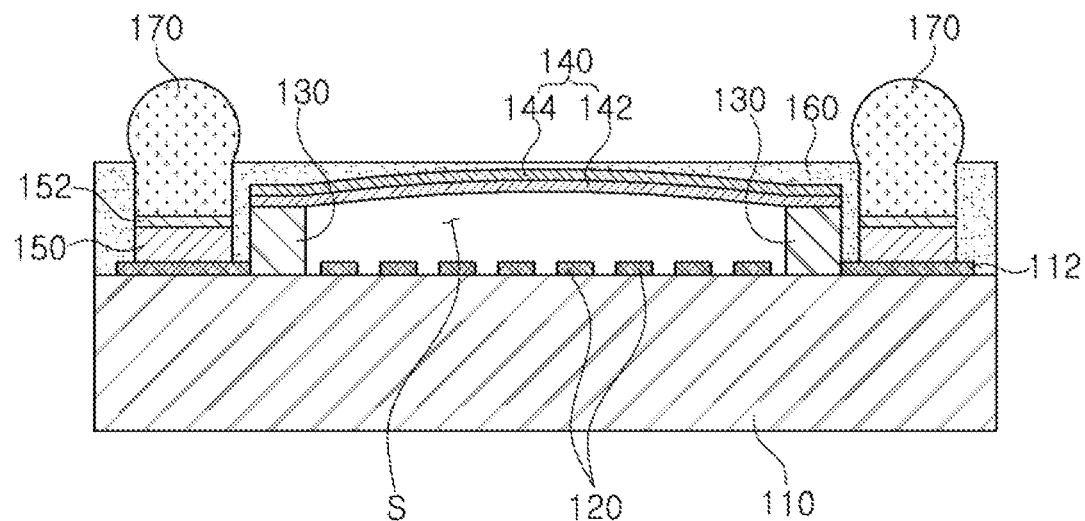

As illustrated in FIG. 9, the bump 170 may be connected to the under-bump metal member 150 and may be disposed as to allow one side of the bump 170 to protrude above the molding layer 160.

The processes described above may be performed on the wafer-level package.

As described above, a central portion of the cap member 140 may have a dome shape, which is upwardly convex. Thus, due to pressure applied when the molding layer 160 is formed, the central portion of the cap member 140 may be prevented from being deformed to be downwardly concave.

Further, due to the first cap member 142 and the second cap member 144 being formed of metal materials, an increase in a thickness, caused by the cap member 140, may be prevented.

In addition, as the cap member 140 is formed in a simple process, the cap member 140 may be prevented from being deformed during the manufacturing process, and the manufacturing process may be less complicated.

Hereinafter, an acoustic wave filter device according to an exemplary embodiment will be described with reference to the accompanying drawings. However, the same reference numerals are used for the same components as those described above, and the detailed description thereof will be omitted.

Figure 10:
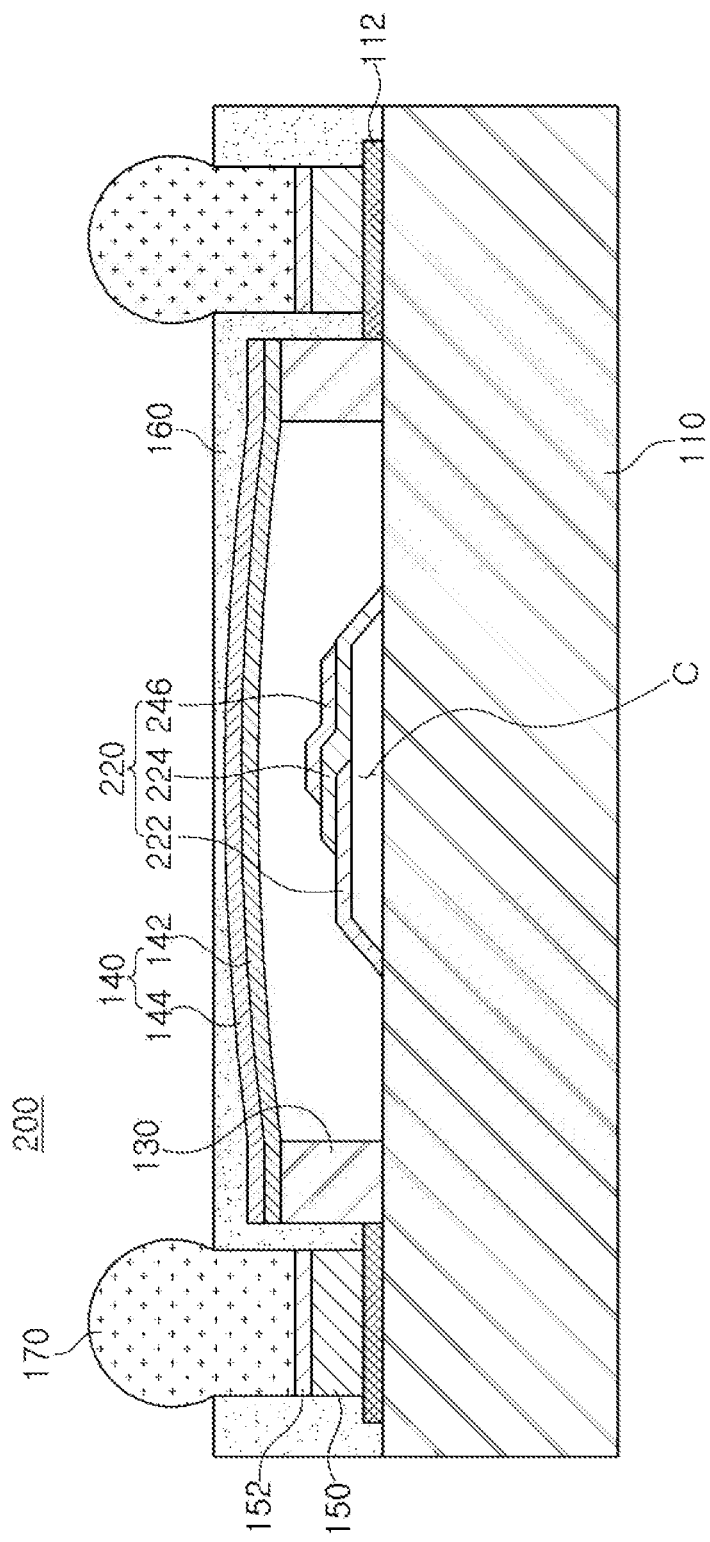
FIG. 10 is a schematic cross-sectional view illustrating an acoustic wave filter device according to an exemplary embodiment.

FIG. 10 is a schematic cross-sectional view illustrating an acoustic wave filter device according to an exemplary embodiment.

Referring to FIG. 10, an acoustic wave filter device 200 may include, for example, a substrate 110, a filter unit 220, a wall member 130, a cap member 140, an under-bump metal member 150, a molding layer 160, and a bump 170.

Certain elements shown in FIG. 10, with the exception the filter unit 220, may correspond to the elements described above regarding FIG. 1, such that a detailed description thereof will be omitted hereinafter.

The filter unit 220 may include, for example, a lower electrode 222 formed on a cavity C, a piezoelectric layer 224 formed to cover at least a portion of the lower electrode 222, and an upper electrode 226 formed to cover at least a portion of the piezoelectric layer 224.

The lower electrode 222 and the upper electrode 226 may be electrically connected to the metal layer 112 formed on the substrate 110.

As set forth above, according to exemplary embodiments, narrowing of an internal space in which a filter unit is disposed due to deformation of a cap member may be reduced.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic wave filter device, comprising:
   a substrate;
   a filter disposed on the substrate;
   a wall member disposed on the substrate and surrounding the filter; and
   a cap member disposed above the wall member and, with the wall member, forming an internal space,
   wherein the cap member has a curved shape and comprises a first cap member comprising a first material and a second cap member comprising a second material.

2. The acoustic wave filter device of claim 1, wherein:
   the first cap member is disposed on the wall member;
   the second cap member is disposed on the first cap member, and
   at least one of the first cap member and the second cap member has a residual stress curvature.

3. The acoustic wave filter device of claim 1, wherein the cap member comprises an upwardly convex central portion.

4. The acoustic wave filter device of claim 2, wherein the first cap member has a same thickness as or thinner thickness than a thickness of the second cap member.

5. The acoustic wave filter device of claim 1, further comprising a metal layer disposed on the substrate outside of the wall member.

6. The acoustic wave filter device of claim 5, further comprising:
   an under-bump metal member disposed on the metal layer.

7. The acoustic wave filter device of claim 6, further comprising:
   a bump disposed on the under-bump metal member; and
   a molding layer disposed such that the under-bump metal member, the wall member, and the cap member are embedded, and such that the bump is partially externally exposed.

8. The acoustic wave filter device of claim 7, wherein a metal film is disposed under the bump and on the under-bump metal member.

9. The acoustic wave filter device of claim 7, wherein the molding layer is disposed on the cap member.

10. The acoustic wave filter device of claim 2, wherein the second material comprising the second cap member has a greater elastic modulus than an elastic modulus of the first material comprising the first cap member.

11. The acoustic wave filter device of claim 2, wherein the first material comprising the first cap member and the second material comprising the second cap member are different metals.

12. A method of manufacturing an acoustic wave filter device, comprising:
   forming a filter on a substrate;
   forming a wall member to surround the filter; and
   forming a cap member having an upwardly convex central portion, the cap member comprising:
      a first cap member formed on the wall member; and
      a second cap member formed on the first cap member.

13. The method of claim 12, wherein the first cap member has a same thickness as or thinner thickness than a thickness of the second cap member.

14. The method of claim 12, wherein the material comprising the first cap member and the material comprising the second cap member are different metals.

15. The method of claim 12, wherein the second material comprising the second cap member has a greater elastic modulus than an elastic modulus of the first material comprising the first cap member.

16. The method of claim 12, wherein the second cap member is formed by an electroless or electrolytic plating process.

17. The method of claim 12, wherein forming the second cap member comprises applying tensile stress to the second cap member when the second cap member is formed such that residual stress remains in the second cap member after the second cap member is formed.

18. The method of claim 12, wherein the forming the first cap member comprises:
   bonding a metal sheet to the wall member; and
   removing an edge of the metal sheet.

19. The method of claim 12, further comprising:
   forming a metal layer on the substrate during a same process as forming the filter on the substrate.

* * * * *